(12) United States Patent
Suzuki et al.

(10) Patent No.: US 7,981,807 B2
(45) Date of Patent: Jul. 19, 2011

(54) MANUFACTURING METHOD OF SEMICONDUCTOR DEVICE WITH SMOOTHING

(75) Inventors: Akira Suzuki, Ota (JP); Takashi Noma, Ota (JP); Hiroyuki Shinogi, Oizumi-machi (JP); Yukihiro Takao, Nitta-machi (JP); Shinzo Ishibe, Oizumi-machi (JP); Shigeki Otsuka, Kumagaya (JP); Keiichi Yamaguchi, Gifu (JP)

(73) Assignee: SANYO Electric Co., Ltd., Moriguchi-shi (JP)

( * ) Notice: Subject to any disclaimer, the term of this patent is extended or adjusted under 35 U.S.C. 154(b) by 107 days.

(21) Appl. No.: 12/051,502

(22) Filed: Mar. 19, 2008

(65) Prior Publication Data

US 2008/0171421 A1    Jul. 17, 2008

Related U.S. Application Data

(62) Division of application No. 10/784,888, filed on Feb. 24, 2004, now Pat. No. 7,371,693.

(30) Foreign Application Priority Data

Feb. 25, 2003  (JP) ................ 2003-046755
Feb. 3, 2004   (JP) ................ 2004-026534

(51) Int. Cl.
    *H01L 21/302*    (2006.01)
(52) U.S. Cl. ................ 438/747; 438/745
(58) Field of Classification Search ........... 438/747, 438/745
See application file for complete search history.

(56) References Cited

U.S. PATENT DOCUMENTS

| 4,276,114 | A | * | 6/1981 | Takano et al. ......... 438/471 |
| 4,612,408 | A | * | 9/1986 | Moddel et al. ......... 136/244 |
| 5,268,065 | A | | 12/1993 | Grupen-Shemansky |
| 5,719,085 | A | | 2/1998 | Moon et al. |
| 5,994,204 | A | | 11/1999 | Young et al. |
| 6,063,232 | A | * | 5/2000 | Terasawa et al. ...... 156/345.23 |

(Continued)

FOREIGN PATENT DOCUMENTS

EP    0475259    3/1992

(Continued)

OTHER PUBLICATIONS

European Search Report Mailed on May 8, 2008 directed to counterpart application No. EP-04004219.4-2203; 3 pages.

(Continued)

*Primary Examiner* — Bradley K Smith
(74) *Attorney, Agent, or Firm* — Morrison & Foerster LLP

(57) ABSTRACT

Cost is reduced and reliability is improved with a CSP type semiconductor device. A glass substrate which works as a supporting plate is bonded through an adhesive to a first surface of a semiconductor wafer on which first wirings are formed. Thickness of the semiconductor wafer is reduced by back-grinding the semiconductor wafer on a second surface of the semiconductor wafer which is opposite to the first surface of the semiconductor wafer. The semiconductor wafer is wet-etched to remove bumps and dips on the second surface of the semiconductor wafer caused during the back-grinding. Then the second surface of the semiconductor wafer is etched to form a tapered groove. The semiconductor wafer is wet-etched to reduce bumps and dips caused by the etching and round a corner of the groove. The wet-etching improves coverage of insulation film, wiring and protection film and enhances yield and reliability of the semiconductor device.

9 Claims, 6 Drawing Sheets

U.S. PATENT DOCUMENTS

| | | |
|---|---|---|
| 6,326,689 B1 | 12/2001 | Thomas |
| 6,350,664 B1 | 2/2002 | Haji et al. |
| 6,498,387 B1 | 12/2002 | Yang |
| 6,506,681 B2 | 1/2003 | Grigg et al. |
| 6,534,379 B1 | 3/2003 | Fisher et al. |
| 6,720,522 B2 | 4/2004 | Ikegami et al. |
| 6,777,767 B2 | 8/2004 | Badehi |
| 2001/0001215 A1 | 5/2001 | Siniaguine et al. |
| 2001/0005043 A1 | 6/2001 | Nakanishi et al. |
| 2002/0013061 A1 | 1/2002 | Siniaguine et al. |
| 2002/0058418 A1* | 5/2002 | Lewis ............ 438/689 |
| 2003/0089950 A1* | 5/2003 | Kuech et al. ........ 257/352 |
| 2004/0124494 A1 | 7/2004 | Ciovacco et al. |
| 2004/0169176 A1* | 9/2004 | Peterson et al. ....... 257/59 |
| 2004/0259332 A1* | 12/2004 | Fukuoka et al. ...... 438/464 |
| 2007/0259473 A1* | 11/2007 | Wu et al. ........... 438/82 |

FOREIGN PATENT DOCUMENTS

| | | |
|---|---|---|
| EP | 1098365 | 5/2001 |
| JP | 59-201425 | 11/1984 |
| JP | 2001-15621 | 1/2001 |
| JP | 2001-144123 | 5/2001 |
| JP | 2002-512436 A1 | 4/2002 |
| JP | 2002-224878 | 8/2002 |
| JP | 2003-516634 | 5/2003 |
| KR | 10-289403 | 12/1999 |
| WO | WO-99/40624 | 8/1999 |

OTHER PUBLICATIONS

Suzuki et al., U.S. Office Action mailed Dec. 16, 2005, directed to U.S. Appl. No. 10/784,888; 6 pages.

Suzuki et al., U.S. Office Action mailed Jun. 7, 2006, directed to U.S. Appl. No. 10/784,888; 5 pages.

Suzuki et al., U.S. Office Action mailed Nov. 30, 2006, directed to U.S. Appl. No. 10/784,888; 6 pages.

Suzuki et al., U.S. Office Action mailed Mar. 20, 2007, directed to U.S. Appl. No. 10/784,888; 6 pages.

Suzuki et al., U.S. Office Action mailed Aug. 7, 2007, directed to U.S. Appl. No. 10/784,888; 6 pages.

* cited by examiner

US 7,981,807 B2

MANUFACTURING METHOD OF SEMICONDUCTOR DEVICE WITH SMOOTHING

CROSS-REFERENCE OF THE INVENTION

This application is a divisional of Ser. No. 10/784,888, filed Feb. 24, 2004, which claims priority to Japanese Patent Applications JP 2003-046755 filed Feb. 23, 2003, and JP 2004-026534 filed Feb. 3, 2004, the contents of which are incorporated herein by reference in their entirety.

BACKGROUND OF THE INVENTION

1. Field of the Invention

This invention relates to a manufacturing method of a CSP (Chip Size Package) type semiconductor device.

2. Description of the Related Art

The CSP receives attention in recent years as a three-dimensional mounting technology as well as a new packaging technology. The CSP means a small package having about the same outside dimensions as those of a semiconductor die packaged in it.

A BGA type semiconductor device has been known as a type of CSP. A plurality of ball-shaped conductive terminals made of metal such as solder is arrayed in a grid pattern on one principal surface of a package of the BGA type semiconductor device and is electrically connected with the semiconductor die mounted on the other side of the package.

When the BGA type semiconductor device is mounted on electronic equipment, the semiconductor die is electrically connected with an external circuit on a printed circuit board by compression bonding of each of the conductive terminals to each of wiring patterns on the printed circuit board.

Such a BGA type semiconductor device has advantages in providing a large number of conductive terminals and in size reduction over other CSP type semiconductor devices such as an SOP (Small Outline Package) and a QFP (Quad Flat Package), which have lead pins protruding from their sides. The BGA type semiconductor device is used as an image sensor chip for a digital camera incorporated into a mobile telephone, for example.

FIGS. 9A and 9B show an outline structure of a conventional BGA type semiconductor device. FIG. 9A is an oblique perspective figure showing a top side of the BGA type semiconductor device. And FIG. 9B is an oblique perspective figure showing a back side of the BGA type semiconductor device.

A semiconductor die 101 is sealed between a first glass substrate 104a and a second glass substrate 104b through epoxy resins 105a and 105b in the BGA type semiconductor device 100. A plurality of ball-shaped conductive terminals (hereafter referred to as conductive terminals) 111 is arrayed in a grid pattern on a principal surface of the second glass substrate 104b, that is, on a back surface of the BGA type semiconductor device 100. The conductive terminals 111 are connected to the semiconductor die 101 through a plurality of second wirings 109. The plurality of second wirings 109 is connected with first wirings pulled out from inside of the semiconductor die 101, making each of the conductive terminals 111 electrically connected with the semiconductor die 101.

More detailed explanation on a cross-sectional structure of the BGA type semiconductor device 100 is given hereafter referring to FIG. 10. FIG. 10 shows a cross-sectional view of the BGA type semiconductor devices 100 divided along dicing lines into individual dice.

The first wiring 103 is provided on an insulation film 102 on a top surface of the semiconductor die 101. The semiconductor die 101 is bonded to the first glass substrate 104a with the resin 105a. A back surface of the semiconductor die 101 is bonded to the second glass substrate 104b with the resin 105b. One end of the first wiring 103 is connected to the second wiring 109. The second wiring 109 extends from the end of the first wiring 103 to a surface of the second glass substrate 104b. The ball-shaped conductive terminal 111 is formed on the second wiring 109 extended onto the second glass substrate 104b.

SUMMARY OF THE INVENTION

The invention provides a method of manufacturing a semiconductor device. The method includes bonding a supporting substrate to a first surface of a semiconductor wafer on which a semiconductor element is formed, and back-grinding a second surface of the semiconductor wafer. The second surface is opposite to the first surface. The method also includes reducing a roughness of the back-ground second surface by etching the back-ground second surface.

The invention provide another method of manufacturing a semiconductor device. The method includes bonding a supporting substrate to a first surface of a semiconductor wafer on which a semiconductor element is formed, and forming a groove in the semiconductor wafer by etching a second surface of the semiconductor wafer. The second surface is opposite to the first surface. The method also includes rounding a corner of the groove by etching the second surface.

DETAILED DESCRIPTION OF THE INVENTION

Figure 9A:
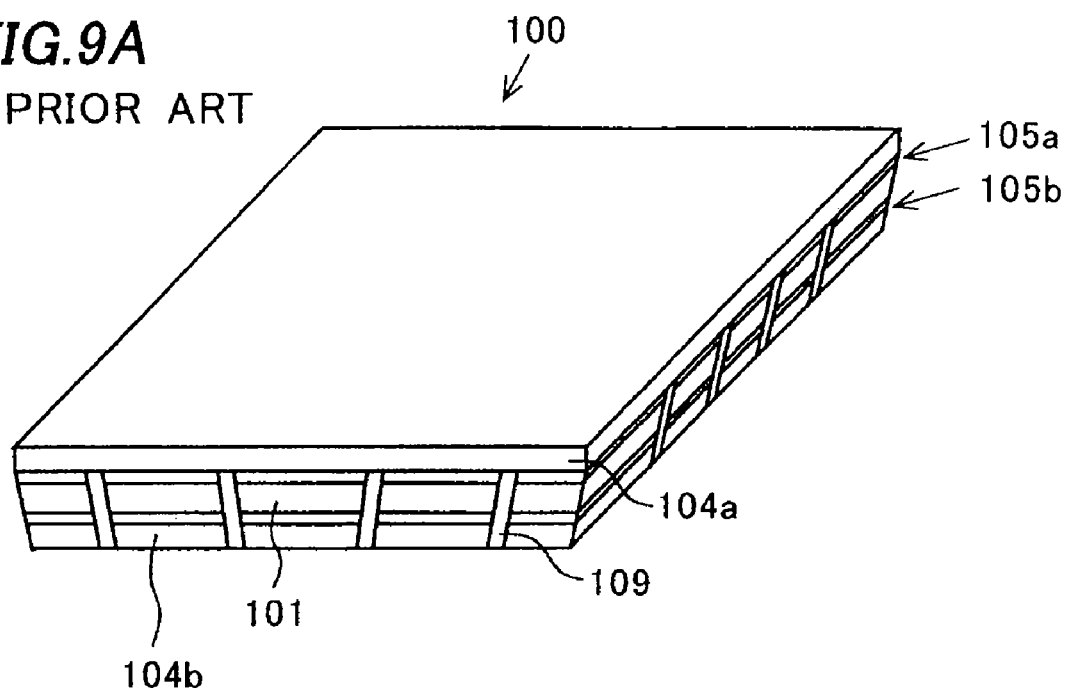
FIGS. 9A and 9B are oblique perspective views showing a manufacturing method of a semiconductor device according to a conventional art.
Figure 9B:
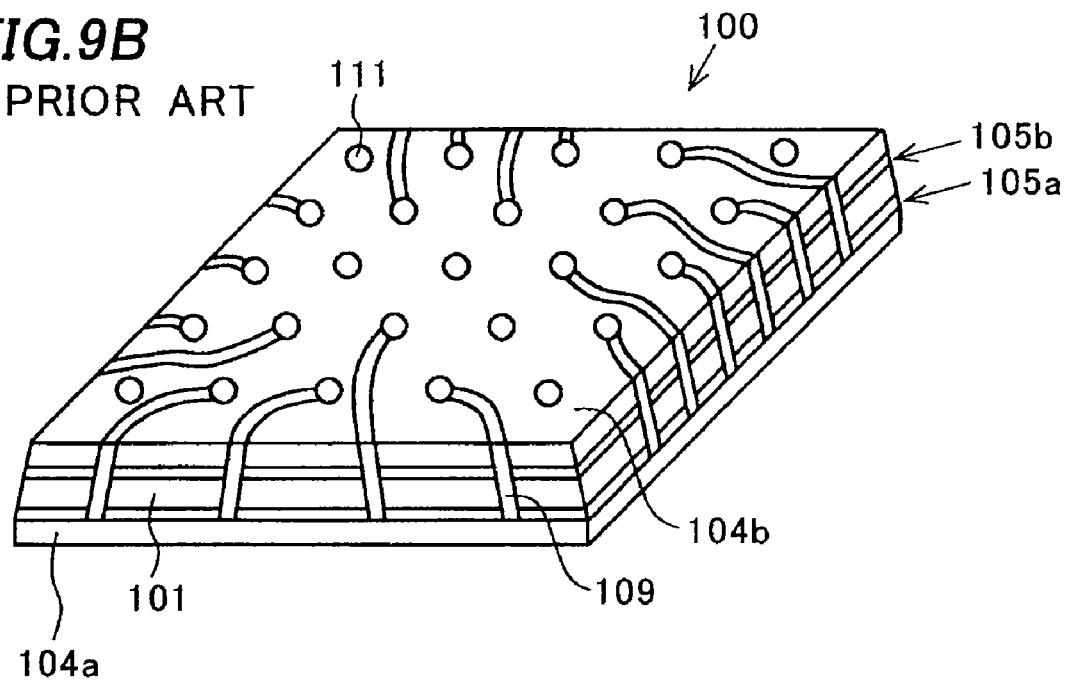
Figure 10:
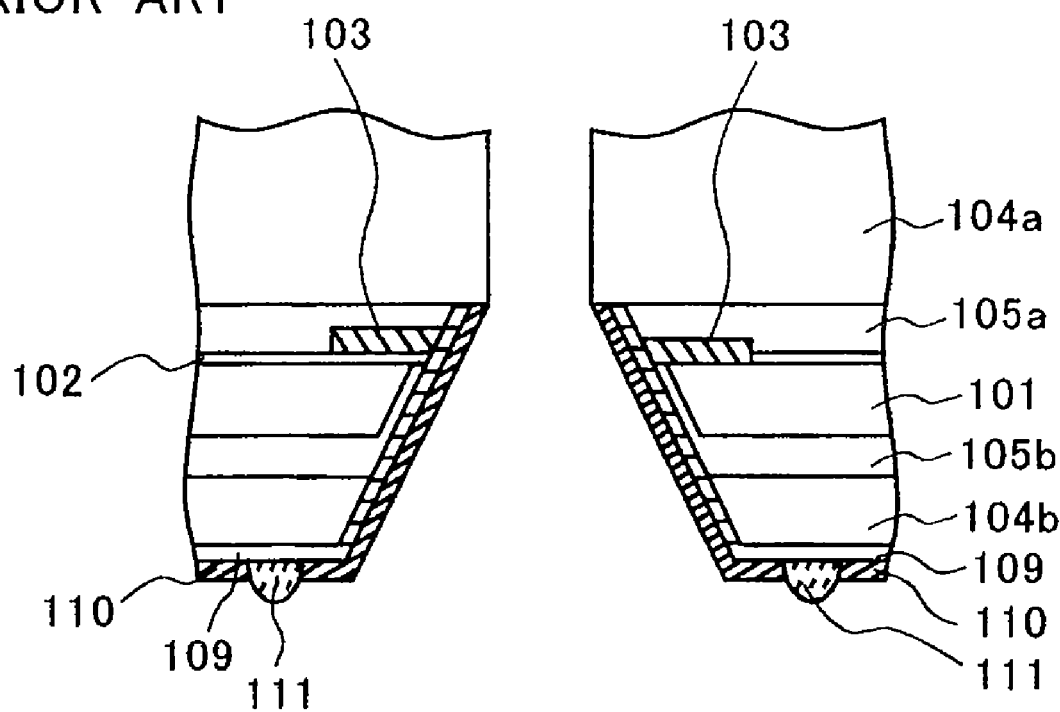
FIG. 10 is a cross-sectional view showing the manufacturing method of the semiconductor device according to the conventional art.

First some of the problems that this invention is directed to will be explained. As shown in FIGS. 9A-10, the glass substrates are bonded to both surfaces of the semiconductor die 101 in the BGA type semiconductor device 100 described above. However, it is not necessarily required that the second glass substrate 104*b* is bonded to the surface on which no semiconductor element is formed, in other words, the surface over which the conductive terminals are disposed. That is to say, there is no need for bonding the second glass substrate as long as the second wiring 109 is insulated from the semiconductor die 101. When the glass substrates are bonded to both surfaces of the semiconductor die, thickness of the two glass substrates makes up most of total thickness of the semiconductor device 100. Thus, the glass substrate is bonded only to the surface of the semiconductor die 101 on which a semiconductor element is formed, so that cost and size of the semiconductor device 100 are reduced. An example of such a semiconductor device will be described using FIG. 8 which is a cross-sectional view of the semiconductor device according to this invention. The semiconductor device similar to the semiconductor device 100 is made by forming an insulation film 7 on the semiconductor die 1 instead of bonding the second glass substrate, and forming a cushioning pad 8, a second wiring 9, a protection film 10 and a conductive terminal 11 over the insulation film 7. However, there are problems to be described bellow in making such semiconductor device.

First, in manufacturing the BGA type semiconductor device, the surface opposite to the surface to which a glass substrate 4 is bonded, that is, a back surface of the semiconductor device is ground by back-grinding, prior to forming the insulation film 7. A semiconductor wafer, in which a plurality of the semiconductor dice is included, is ground with a whetstone in the back-grinding. The back-grinding transfers bumps and dips on the whetstone to the surface of the wafer and causes scratches extending several microns in depth and length. The back-grinding scarcely causes a problem in the case of the semiconductor device 100 shown in FIG. 10, since the bumps and dips on the surface of the wafer due to the scratches are covered by the resin 105*b*.

However, in the case of the BGA type semiconductor device having the glass substrate only on the surface on which the semiconductor element is formed, like in the case of the semiconductor device of this embodiment, it is required that an insulation film 7 is formed on the back-ground surface of the wafer in order to provide insulation between the die and the second wiring. Because the insulation film 7 is formed with a CVD (Chemical Vapor Deposition) apparatus, the bumps and dips on the surface of the wafer are transferred to the insulation film 7 and the surface of the insulation film 7 is formed uneven. This causes poor coverage of photoresist films used in patterning the insulation film 7 and the second wiring 9. The poor coverage of the photoresist film used in patterning the insulation film 7 may cause pinholes or cracks, making a contributing factor to deteriorate yield and reliability of the semiconductor device.

Next problem is as follows. After the back-grinding, grooves are formed by etching the semiconductor wafer along border lines in order to divide the semiconductor wafer into individual semiconductor dice. Residues and foreign particles attached to the etched surface of the semiconductor wafer cause bumps and dips on the surface of the semiconductor wafer. Also sharp edges are left at corners of the grooves after the etching. As a result, coverage of photoresist films for patterning, the second wiring 9 and the protection film 10 to be formed after forming the grooves is degraded, making additional factors to deteriorate yield and reliability of the semiconductor device.

This invention is directed to solve the problems addressed above, and offers a method to resolve the problems due to the bumps and dips on the surface of the back-ground semiconductor wafer, the bumps and dips on the surface of the etched semiconductor wafer and the sharp edges at the corners left after forming the grooves.

A manufacturing method of a semiconductor device according to an embodiment of this invention will be described referring to FIGS. 1 through 8.

Figure 1:
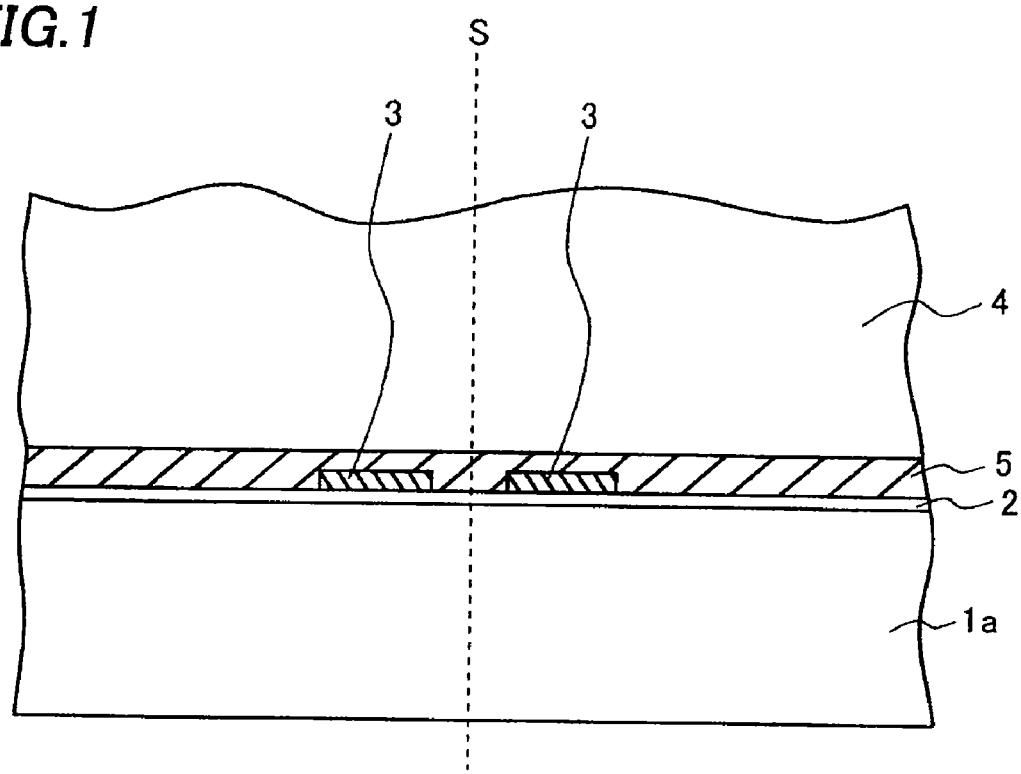
FIG. 1 is a cross-sectional view showing a manufacturing method of a semiconductor device according an embodiment of this invention.

A semiconductor wafer 1*a*, which will form semiconductor dice 1 in later process steps, is provided as shown in FIG. 1. The semiconductor dice 1 are CCD image sensor chips, for example, and are manufactured by a semiconductor wafer processing. A pair of first wirings 3 separated by a predetermined spacing is formed on a first surface of the semiconductor wafer through an insulation film 2 near a border (referred to as a dicing line or a scribe line) S for dividing the wafer 1*a* into individual semiconductor dice 1. Each of the pair of first wirings 3 makes a pad extended from a bonding pad in the semiconductor die 1 to proximity of the border S. That is, each of the pair of first wirings 3 is a pad for external connection, and is electrically connected with a circuit in the semiconductor die 1, which is not shown in the figure.

Then a supporting plate is bonded with an adhesive to the first surface of the semiconductor wafer 1*a* on which the first wirings 3 are formed. A transparent epoxy resin 5 is used as the adhesive and a transparent glass substrate 4 is used as the supporting plate in this embodiment. When the BGA type semiconductor device of this invention is manufactured to house an LSI such as a memory or a microcomputer and does not house the CCD, an opaque plastic supporting plate may be bonded using a suitable adhesive.

Figure 2:
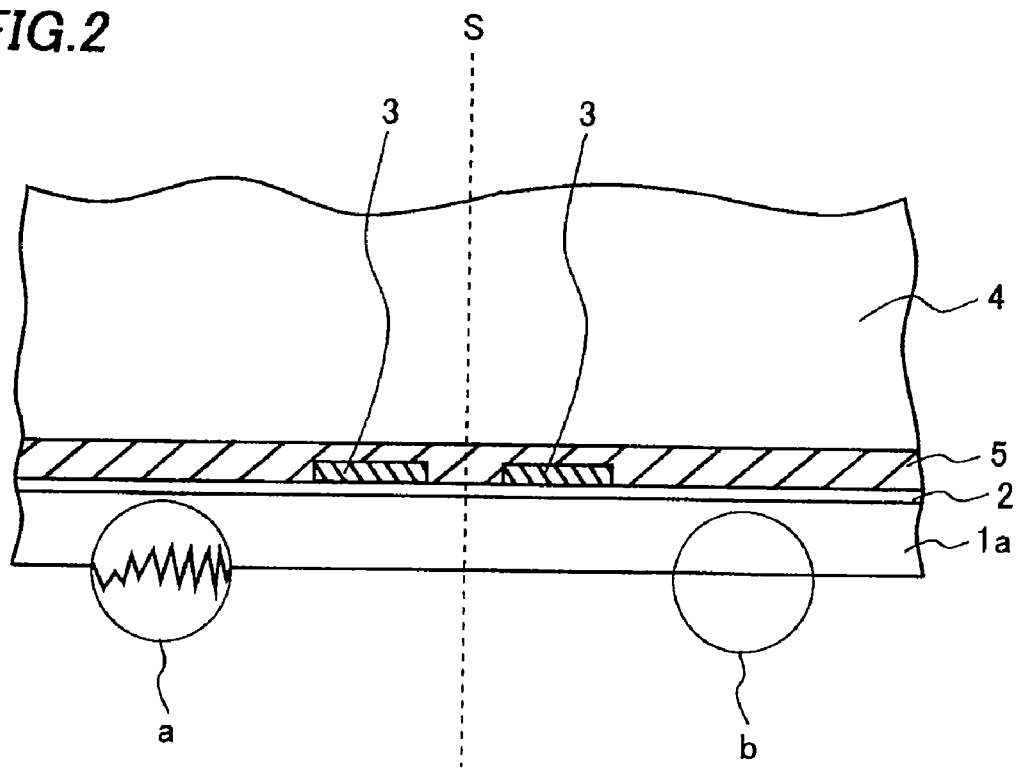
FIG. 2 is a cross-sectional view showing the manufacturing method of the semiconductor device according the embodiment of this invention.

A second surface of the semiconductor wafer 1*a* opposite to the first surface to which the glass substrate 4 is bonded is back-ground to reduce a thickness of the wafer, as shown in FIG. 2. The thickness of the back-ground wafer is about 230 μm.

On the back-ground second surface of the semiconductor wafer 1*a*, scratches are formed to produce bumps and dips extending several microns in width and depth, as shown in an encircled portion a (a surface before etching) in FIG. 2. The second surface of the semiconductor wafer 1*a* is wet-etched using a chemical solution having high selection ratio between an etch rate of silicon (hereafter referred to as Si) which is a material forming the semiconductor wafer 1*a* and an etch rate of silicon dioxide (hereafter referred to as $SiO_2$) which is a material forming the glass substrate 4. The semiconductor wafer 1*a* is reduced in thickness by 5 to 30 μm by the wet-etching to obtain a surface with reduced bumps and dips, as shown in an encircled portion b (a surface after etching) in FIG. 2.

Any etching solution may be used in the wet-etching, as long as it has high selection ratio between the etch rate of Si and the etch rate of $SiO_2$. For example, a mixed solution composed of 2.5% of hydrofluoric acid, 50% of nitric acid, 10% of acetic acid and 37.5% of water is used as the wet-etching solution in this embodiment.

Either of methods described below may be used as the wet-etching method.

A first method is to reduce the bumps and dips on the second surface by wet-etching which includes dripping the chemical solution on the semiconductor wafer 1*a* with the glass substrate 4 bonded to it while holding the wafer so that the back-ground second surface of the semiconductor wafer 1*a* faces upward and spreading the chemical solution all over the second surface of the semiconductor wafer 1*a* by spinning the semiconductor wafer 1*a* around its center. This is similar to spin coating of a resist material.

In this method, the roughness on the second surface is further reduced by reversing direction of rotation of the semiconductor wafer 1a to spread the chemical solution more equally all over the second surface of the semiconductor wafer 1a.

A second method is to reduce the roughness on the second surface by wet-etching performed by dipping the semiconductor wafer 1a into the chemical solution. The roughness on the second surface is more uniformly reduced by the second method than by the first method described above, because the chemical solution pervades all the second surface of the semiconductor wafer 1a more uniformly by the second method than the first method.

A third method is to reduce the roughness on the background second surface of the semiconductor wafer 1a by CMP (Chemical Mechanical Polishing).

Instead of the wet-etching, the roughness on the second surface of the semiconductor wafer 1a may be reduced by dry-etching the back-ground second surface of the semiconductor wafer while holding it upward.

Figure 3:
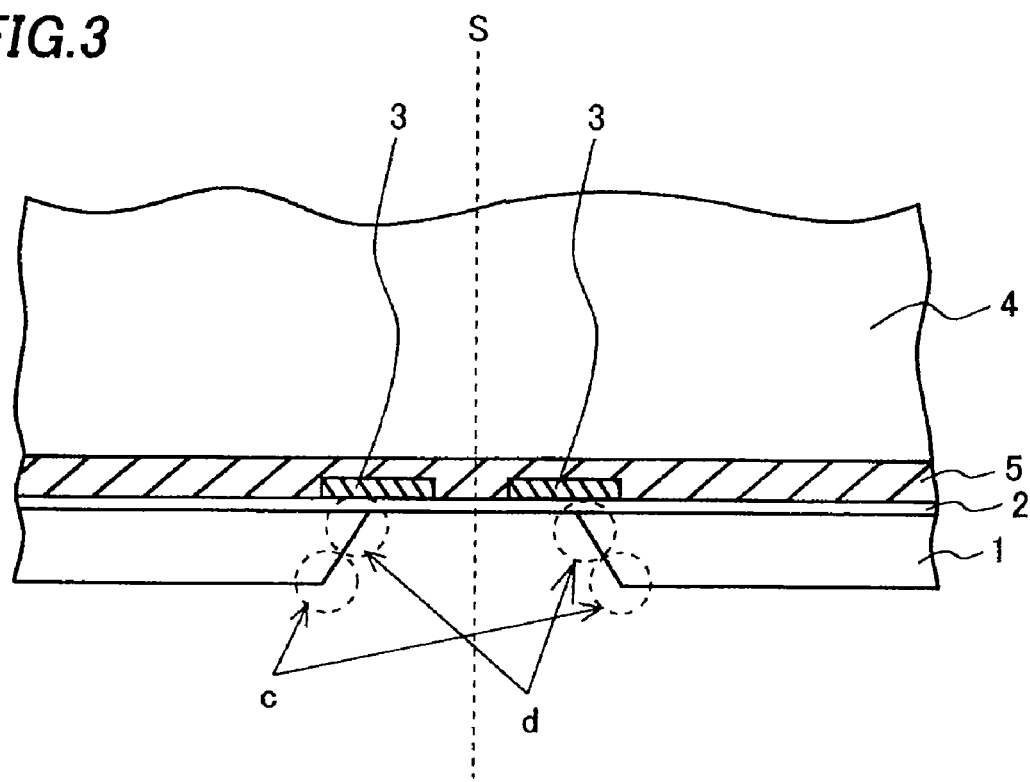
FIG. 3 is a cross-sectional view showing the manufacturing method of the semiconductor device according the embodiment of this invention.

After the wet-etching, a photoresist film (not shown in the figure) which has an opening along the border S is formed on the second surface of the semiconductor wafer 1a opposite to the first surface to which the glass substrate 4 is bonded, as shown in FIG. 3. Isotropic etching of the semiconductor wafer 1a using the photoresist film as a mask forms a tapered groove along the border S to expose the insulation film 2. Although the semiconductor wafer 1a is divided into individual dice 1 by the isotropic etching, the semiconductor dice 1 are held together with the glass substrate 4, keeping the separated dice 1 together as one unit.

Note that the isotropic etching may be performed by either dry-etching or wet-etching.

Bumps and dips as well as residues and foreign particles from the etching are left on the second surface of the semiconductor wafer 1a after forming the groove. In addition, the semiconductor dice have sharp edges at corners of the groove as shown in circles denoted as c and d in FIG. 3.

Figure 4:
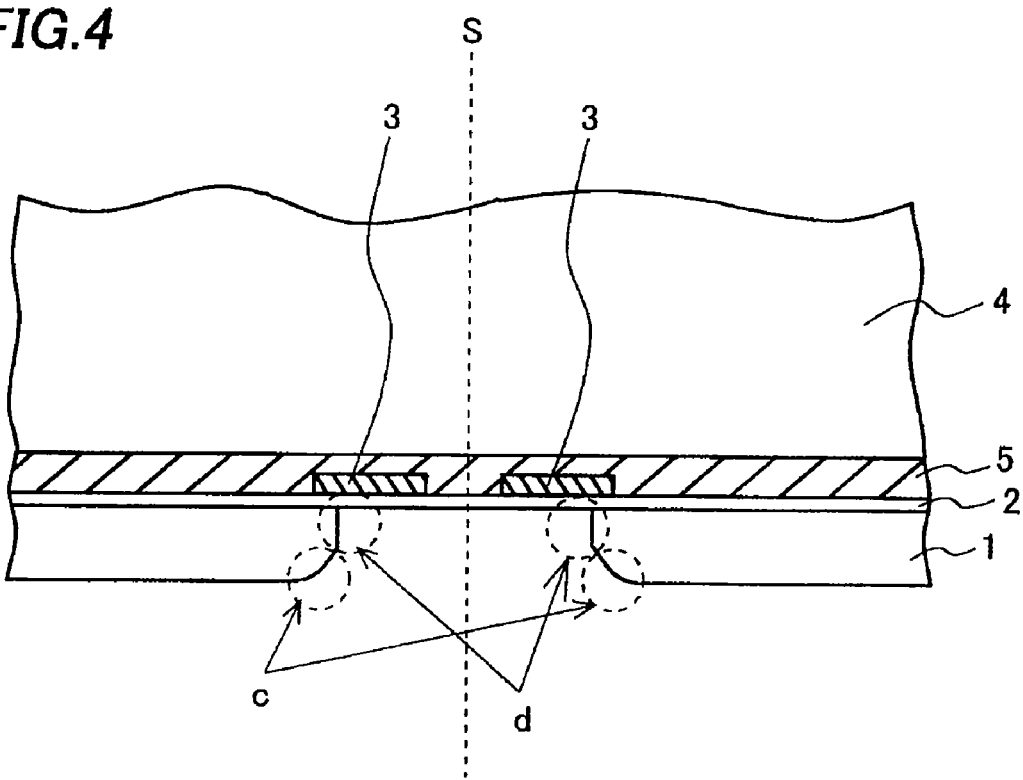
FIG. 4 is a cross-sectional view showing the manufacturing method of the semiconductor device according the embodiment of this invention.

Wet-etching is performed to reduce the residues and the foreign particles and round the sharp edges as shown in FIG. 4. The sharp edges shown in portions c and d in FIG. 3 are rounded off as shown in portions c and d in FIG. 4.

Chemical solution similar to one used in the wet-etching after the back-grinding may be used in the wet-etching after forming the groove. Following methods are applicable to the wet-etching after forming the groove.

A first method of wet-etching after forming the groove is dripping the chemical solution on the semiconductor wafer 1a while holding the surface with the groove upward and spreading the chemical solution all over the surface with the groove of the semiconductor wafer 1a by spinning the semiconductor wafer 1a.

In this method, uniformity of the etching over the surface with the groove is improved by reversing direction of rotation of the semiconductor wafer 1a to spread the chemical solution more equally all over the surface with the groove of the semiconductor wafer 1a.

A second method of the wet-etching after forming the groove is dipping the semiconductor wafer 1a into the chemical solution. The uniformity of etching over the surface with the groove is improved by the second method, because the chemical solution pervades the entire surface with the groove of the semiconductor wafer 1a more uniformly by the dipping than the wet-etching by the first method described above.

Instead of the wet-etching, dry-etching may be applied to the surface with the groove of the semiconductor wafer 1a after forming the groove to round the sharp edges at the corners of the groove.

Figure 5:
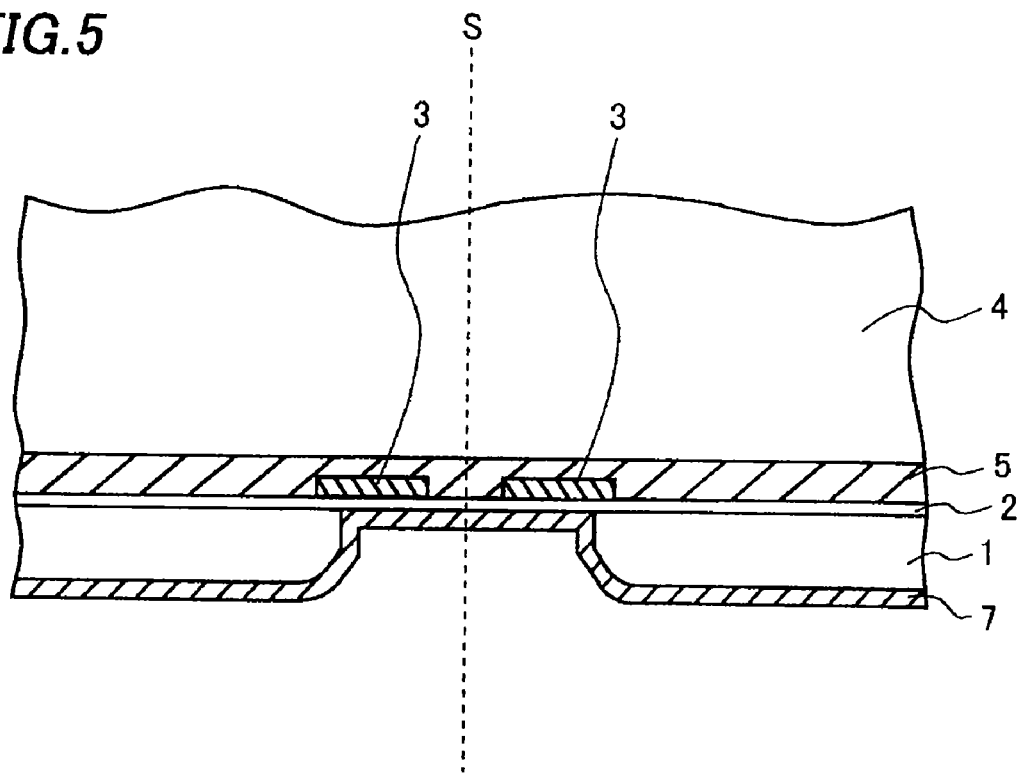
FIG. 5 is a cross-sectional view showing the manufacturing method of the semiconductor device according the embodiment of this invention.

After the wet-etching, the insulation film 7 is formed on the surface of the semiconductor wafer 1a opposite to the surface to which the glass substrate 4 is bonded, as shown in FIG. 5. A silane-based oxide film of 3 µm in thickness is formed in this embodiment.

Figure 6:
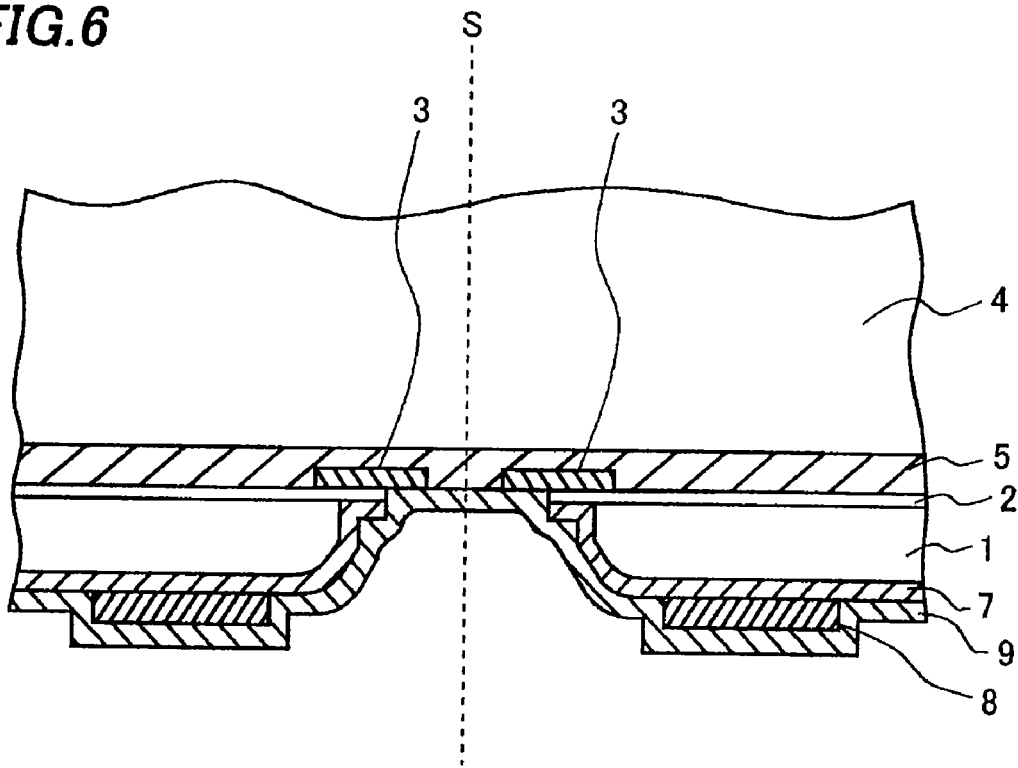
FIG. 6 is a cross-sectional view showing the manufacturing method of the semiconductor device according the embodiment of this invention.

A photoresist film (not shown) is applied on the insulation film 7 and patterning in the insulation film 7 is made to expose a portion of a bottom surface of each of the first wirings 3, as shown in FIG. 6. That is, the insulation film 7 and the insulation film 2 are etched off using the photoresist film as a mask to expose the portion of the bottom surface of each of the first wirings 3. Next, flexible cushioning pads 8 are formed at locations above which the conductive terminals 11 are to be formed. The cushioning pads 8 have function to absorb power applied through the conductive terminals 11 and relax stress when the conductive terminals 11 are bonded. However this embodiment does not necessarily require the cushioning pads 8.

Then the second wiring 9 is formed on the surface opposite to the surface to which the glass substrate 4 is bonded. The first wirings 3 are electrically connected with the second wiring 9.

Figure 7:
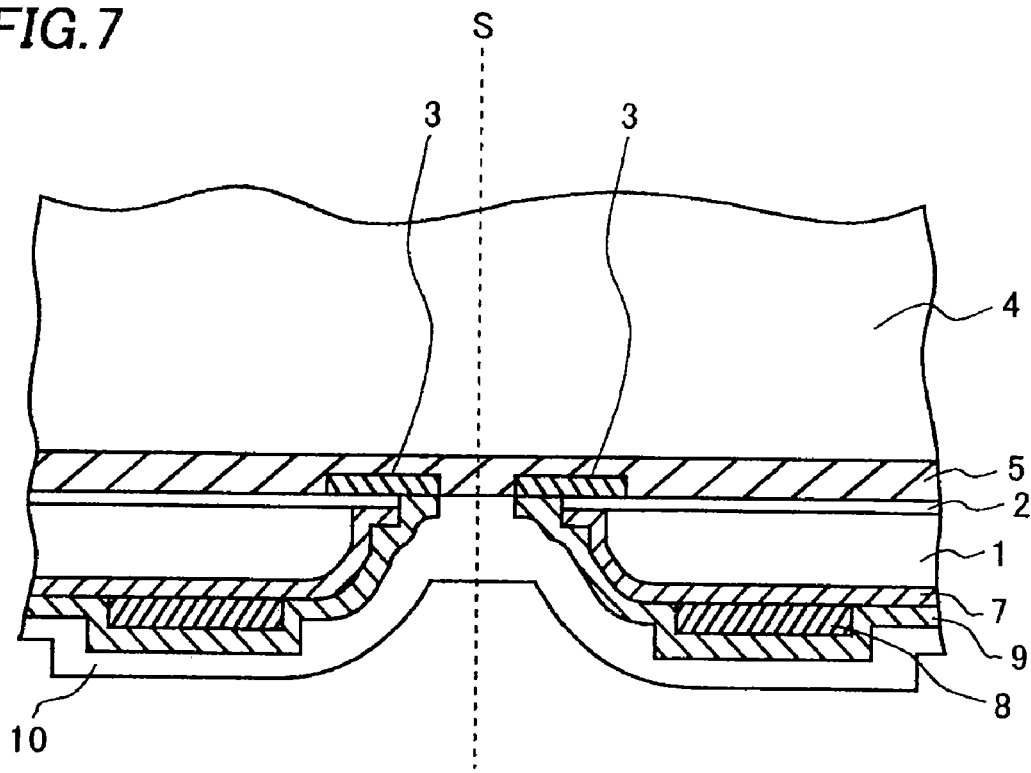
FIG. 7 is a cross-sectional view showing the manufacturing method of the semiconductor device according the embodiment of this invention.

A photoresist film (not shown) is applied on the surface opposite to the surface to which the glass substrate 4 is bonded and patterning is made to form an opening in the photoresist film along the border S, as shown in FIG. 7. Etching is performed using the photoresist film as a mask to remove a portion of the second wiring 9 along the border S. After patterning the second wiring 9, electroless plating is made on the surface opposite to the surface to which the glass substrate 4 is bonded so that Ni—Au plating (not shown) is applied on the second wirings 9.

Then the protection film 10 is formed on the surface opposite to the surface to which the glass substrate 4 is bonded. In order to form the protection film 10, the surface opposite to the surface to which the glass substrate 4 is bonded is held upward, a thermosetting organic resin is dropped on it and the organic resin is spread over the surface by spinning the semiconductor wafer 1a utilizing centrifugal force. The protection film 10 is formed on a surface of the second wirings 9.

Figure 8:
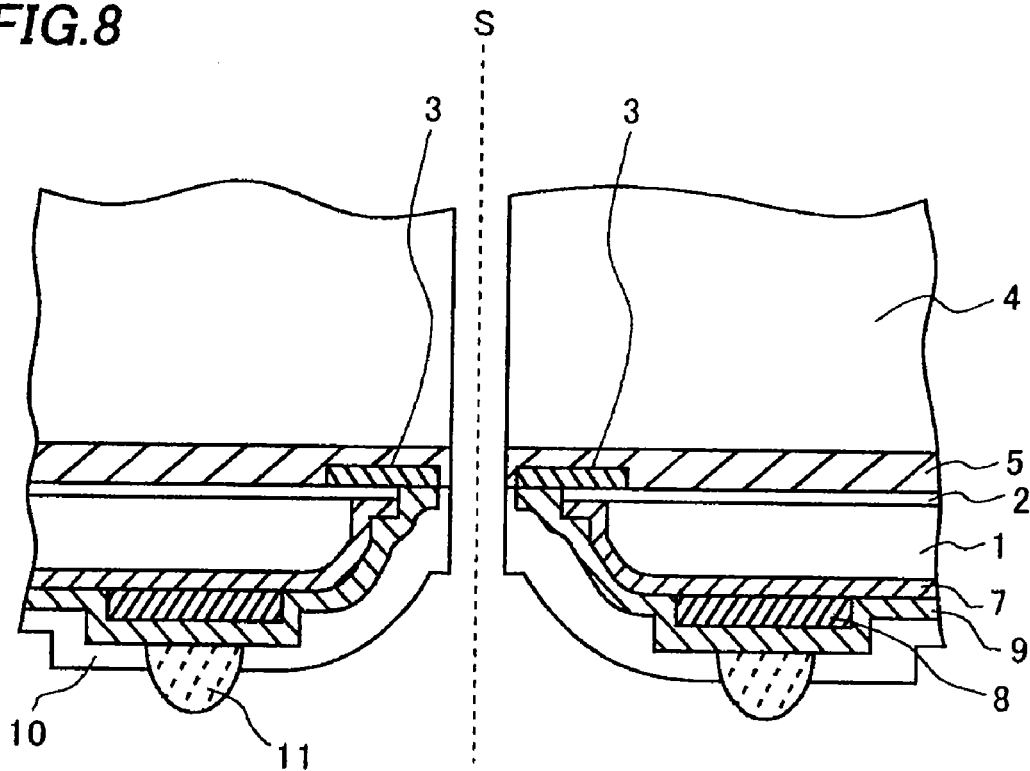
FIG. 8 is a cross-sectional view showing the manufacturing method of the semiconductor device according the embodiment of this invention.

Portions of the protection film 10 at locations where the conductive terminals 11 are to be formed (i.e. locations on the cushioning pads 8) are removed by etching using a photoresist film (not shown) as a mask, as shown in FIG. 8. Then the conductive terminals 11 are formed on the second wirings 9 at the locations exposed by the etching (locations corresponding to the cushioning pads 8). Finally, the protection film 10, the resin 5 and the glass substrate 4 are cut along the border S to complete the BGA type semiconductor device.

The embodiment described above is directed to the BGA type semiconductor device having the ball-shaped conductive terminals 11. However, this embodiment is not limited to the BGA type semiconductor device and may be applied to a semiconductor device which does not have the ball-shaped conductive terminals such as an LGA (Land Grid Array) type semiconductor device, for example.

With this invention, the problems in manufacturing the CSP type semiconductor device are solved and yield, and reliability of the CSP type semiconductor device are improved.

What is claimed is:

1. A method of manufacturing a semiconductor device, comprising:

providing a semiconductor wafer comprising a first semiconductor element and a second semiconductor element that are formed on an insulation film formed on a first surface of the semiconductor wafer;

forming a first wiring for the first semiconductor element on the insulation film and a second wiring for the second semiconductor element on the insulation film so that the first and second wirings are disposed adjacent a border between the first and second semiconductor elements;

bonding a supporting substrate with an adhesive to the first surface so that the first and second wirings are covered with the supporting substrate;

back-grinding a second surface of the semiconductor wafer, the second surface being opposite to the first surface;

reducing a roughness of the back-ground second surface by etching the back-ground second surface;

etching selectively the semiconductor wafer to form a groove in the semiconductor wafer at the border;

wet etching the second surface after forming the groove so as to round a corner of the groove; and forming an insulation film on the etched and back-ground second surface.

2. The method of claim 1, wherein the etching of the back-ground second surface before forming the groove comprises a wet etching.

3. The method of claim 2, wherein the wet etching of the back-ground second surface comprises dipping the semiconductor wafer into an etching solution.

4. The method of claim 2, wherein at least one of the wet etchings comprises dipping the semiconductor wafer into an etching solution.

5. The method of claim 2, wherein the wet etching comprises dropping an etching solution on the back-ground second surface and spinning the semiconductor wafer to spread the etching solution over the second surface.

6. The method of claim 5, wherein a direction of the spinning is reversed during the wet etching.

7. The method of claim 2, wherein the wet etching is performed so as to remove a foreign substance from the back-ground second surface.

8. The method of claim 1, wherein the wet etching after forming the groove comprises dropping an etching solution on the second surface and spinning the semiconductor wafer to spread the etching solution over the second surface.

9. The method of claim 8, wherein a direction of the spinning is reversed during the wet etching.

\* \* \* \* \*